US008792593B2

(12) United States Patent
Yamagishi (10) Patent No.: US 8,792,593 B2
(45) Date of Patent: Jul. 29, 2014

(54) RADIO RECEIVER AND METHOD FOR CONTROLLING RADIO RECEIVER

(75) Inventor: Toshiyuki Yamagishi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 336 days.

(21) Appl. No.: 13/231,616

(22) Filed: Sep. 13, 2011

(65) Prior Publication Data

US 2012/0236975 A1    Sep. 20, 2012

(30) Foreign Application Priority Data

Mar. 14, 2011   (JP) ................................. 2011-055735

(51) Int. Cl.
  *H04L 27/22*   (2006.01)
(52) U.S. Cl.
  USPC ........................................................ 375/332
(58) Field of Classification Search
  USPC ......... 375/279, 280, 281, 284, 324–327, 329, 375/332; 329/304, 306, 307, 308, 345; 455/205, 214, 226.1, 295
  See application file for complete search history.

(56) References Cited

U.S. PATENT DOCUMENTS

| | | | |
|---|---|---|---|
| 6,317,589 B1 * | 11/2001 | Nash ........................... | 455/245.2 |
| 6,744,829 B1 | 6/2004 | Mohindra | |
| 2004/0066861 A1 * | 4/2004 | Song et al. ..................... | 375/316 |
| 2006/0198475 A1 * | 9/2006 | Wu et al. ........................ | 375/346 |
| 2007/0047737 A1 * | 3/2007 | Lerner et al. .................... | 381/22 |
| 2007/0127599 A1 * | 6/2007 | Song et al. ..................... | 375/326 |
| 2008/0025381 A1 | 1/2008 | Lee et al. | |
| 2009/0119043 A1 | 5/2009 | Tao et al. | |
| 2010/0215125 A1 * | 8/2010 | Furman ......................... | 375/319 |

FOREIGN PATENT DOCUMENTS

| | | |
|---|---|---|
| CN | 1446397 A | 10/2003 |
| CN | 101388729 A | 3/2009 |
| JP | 2003-032314 | 1/2003 |
| JP | 2009-540672 | 12/2007 |
| JP | 2008-167057 | 7/2008 |
| JP | 4215403 | 11/2008 |

OTHER PUBLICATIONS

Japanese Office Action mailed on Jun. 4, 2013 with an English translation in corresponding Japanese Application No. 2011-055735.
Chinese Office Action issued on Mar. 4, 2014 in corresponding Chinese Application No. 201110277695.4, along with English translation.

* cited by examiner

*Primary Examiner* — Young T. Tse
(74) *Attorney, Agent, or Firm* — White & Case LLP (57) ABSTRACT

According to one embodiment, a radio receiver includes an antenna, a low-noise amplifier (LNA), a quadrature demodulator, an analog-to-digital converter (ADC), first and second power calculators, a correlation value calculator, a correction parameter generator, a corrector, a demodulator, and a controller. The antenna receives a signal. The LNA amplifies the received signal. The quadrature demodulator demodulates the amplified signal. The ADC converts analog IQ into digital IQ. The first and second power calculators calculate the first and second powers, respectively. The correlation value calculator calculates a correlation value between the digital IQ. The correction parameter generator generates a correction parameter based on the first and second power expected values, and the correlation value between the digital IQ. The corrector performs a linear transform operation. The demodulator demodulates the corrected IQ. The controller generates a gain control signal. The LNA is operated on the basis of the gain control signal.

20 Claims, 8 Drawing Sheets

RADIO RECEIVER AND METHOD FOR CONTROLLING RADIO RECEIVER

CROSS REFERENCE TO RELATED APPLICATIONS

This application is based upon and claims the benefit of priority from the prior Japanese Patent Application No. 2011-055735, filed on Mar. 14, 2011, the entire contents of which are incorporated herein by reference.

FIELD

Embodiments described herein relate generally to a radio receiver and a method for controlling the radio receiver.

BACKGROUND

Generally, a radio receiver includes various analog circuits. Recently, in the radio receiver, a technology for replacing some of analog circuits with digital circuits is employed for the purpose of higher performance and miniaturization.

Conventionally, a function of correcting a deviation (IQ imbalance) between an in-phase component and a quadrature component of a radio signal, which is one of functions of the radio receiver, is implemented by the digital circuit. When receiving the radio signal, the digital circuit refers to a well-known portion of the radio signal, estimates an imbalance amount based on the referred portion (reference signal), and corrects the IQ imbalance based on the estimated imbalance amount.

However, in the radio signal, there is not only the IQ imbalance of the radio receiver, but also there are incomplete factors such as an IQ imbalance of a radio transmitter that transmits the radio signal and a communication distortion. Furthermore, the reference signal exists only in a limited frequency of the radio signal. Accordingly, correction accuracy of the imbalance amount is low.

On the other hand, there is a technology for providing a reference signal generator with the radio receiver in order to improve the correction accuracy of the imbalance amount. However, a circuit size and production cost of the radio receiver are increased by the reference signal generator.

DETAILED DESCRIPTION

Embodiments will now be explained with reference to the accompanying drawings.

In general, according to one embodiment, a radio receiver includes an antenna, a low-noise amplifier, a quadrature demodulator, an analog-to-digital converter (ADC), a first power calculator, a second power calculator, a correlation value calculator, a correction parameter generator, a corrector, a demodulator, and a controller. The antenna receives a radio signal. The low-noise amplifier amplifies an output signal of the antenna with a low noise. The quadrature demodulator demodulates an output signal of the low-noise amplifier, and generates an analog I signal of an in-phase component and an analog Q signal of a quadrature component. The ADC converts the analog I signal into a digital I signal of the in-phase component and converts the analog Q signal into a digital Q signal of the quadrature component. The first power calculator calculates a first power of the digital I signal. The second power calculator calculates a second power of the digital Q signal. The correlation value calculator calculates a correlation value between the digital I signal and the digital Q signal. The correction parameter generator generates a correction parameter based on the first power expected value, the second power expected value, and the correlation value between the digital I signal and the digital Q signal. The corrector performs a linear transform operation using the correction parameter, corrects an IQ imbalance of the digital I signal and the digital Q signal, and generates a corrected I signal and a corrected Q signal. The demodulator demodulates the corrected I signal and the corrected Q signal, and generates a demodulated signal. The controller generates a gain control signal in order to control a gain of the low-noise amplifier in such a manner that a thermal noise mixed by the low-noise amplifier is larger than a quadrature demodulation noise mixed by the quadrature demodulator and an analog-digital conversion noise mixed by the analog-digital converter. The low-noise amplifier is operated on the basis of the gain control signal.

First Embodiment

A first embodiment of the invention will be described. The first embodiment is an example in which a correction parameter is calculated in order to correct the IQ imbalance based on a first power of a digital I signal, a second power of a digital Q signal, and a correlation value between the digital I signal and the digital Q signal.

Figure 1:
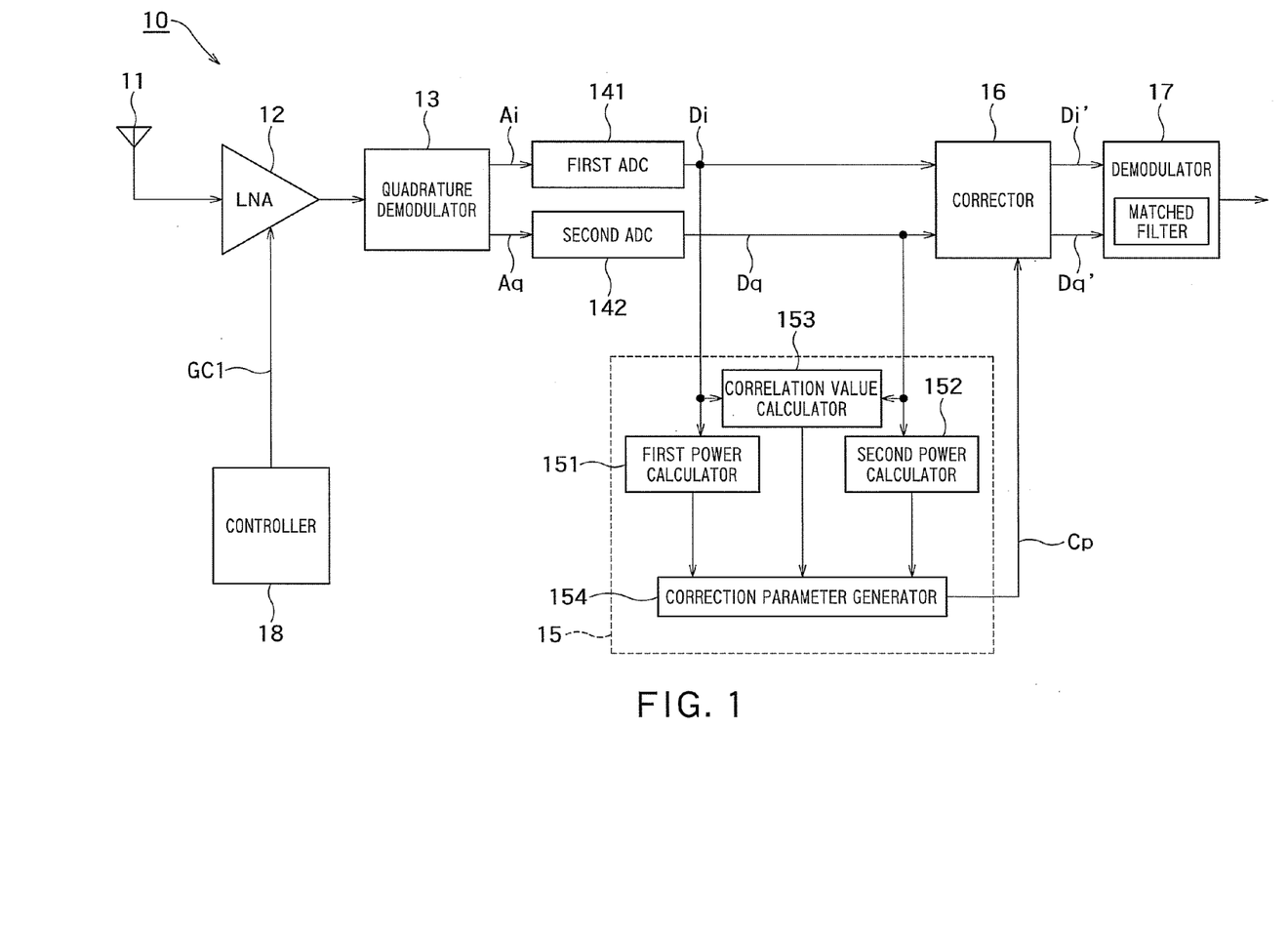
FIG. 1 is a configuration diagram illustrating a radio receiver 10 of the first embodiment.

A configuration of a radio receiver according to the first embodiment will be described below. FIG. 1 is a configuration diagram illustrating a radio receiver 10 of the first embodiment.

The radio receiver 10 of FIG. 1 includes an antenna 11, a Low Noise Amplifier (LNA) 12, a quadrature demodulator 13, a first Analog to Digital Converters (ADC) 141, a second ADC 142, a correction controller 15, a corrector 16, a demodulator 17, and a controller 18. The correction controller 15 includes a first power calculator 151, a second power calculator 152, a correlation value calculator 153, and a correction parameter generator 154.

The controller 18 generates a first gain control signal GC1 for controlling a gain of the LNA 12 such that a thermal noise mixed by the LNA 12 is significantly larger than a quadrature demodulation noise mixed by the quadrature demodulator 13 and an Analog to Digital (AD) conversion noise mixed by the first ADC 141 and the second ADC 142.

The antenna 11 receives a radio signal transmitted from a base station (not illustrated) or a radio transmitter (not illustrated).

The LNA 12 amplifies an output signal of the antenna 11 with a low noise based on the first gain control signal GC1.

The thermal noise is mixed in the output signal of the LNA 12. Because the thermal noise is significantly larger than an antenna noise, a noise component of the output signal of the LNA 12 is substantially equal to the thermal noise.

The quadrature demodulator 13 demodulates the output signal of the LNA 12 to generate an analog in-phase-channel signal (analog I signal) Ai of an in-phase component and an analog quadrature-phase-channel signal (analog Q signal) Aq of a quadrature component. The quadrature demodulation noise is mixed in the analog I signal Ai and the analog Q signal Aq. Because the controller 18 generates the first gain control signal GC1, the quadrature demodulation noise is significantly smaller than the thermal noise. Accordingly, the noise component mixed in the analog I signal Ai and the analog Q signal Aq is substantially equal to the thermal noise.

The first ADC 141 converts the analog I signal Ai into a digital I signal Di. The second ADC 142 converts the analog Q signal Aq into a digital Q signal Dq. The digital I signal Di and the digital Q signal Dq are influenced by the IQ imbalance caused by the quadrature demodulator 13, the first ADC 141 and the second ADC 142. Accordingly, a phase of the digital I signal Di is deviated from an ideal in-phase component by an imbalance amount, and a phase of the digital Q signal Dq is deviated from an ideal quadrature component by the imbalance amount. The AD conversion noise is mixed in the digital I signal Di and the digital Q signal Di. Since the controller 18 generates the first gain control signal GC1, the AD conversion noise is significantly smaller than the thermal noise. Accordingly, the noise component mixed in the digital I signal Di and the digital Q signal Dq is substantially equal to the thermal noise.

The correction controller 15 uses an Additive White Gaussian Noise (AWGN) model to model the thermal noise mixed in the digital I signal Di and the digital Q signal Dq and the correction controller 15 generates a correction parameter Cp to correct the IQ imbalance.

The first power calculator 151 and the second power calculator 152 calculate the first power of the digital I signal Di and the second power of the digital Q signal Dq, respectively. The correlation value calculator 153 calculates the correlation value between the digital I signal and the digital Q signal. The correction parameter generator 154 generates the correction parameter Cp based on the first power, the second power, and the correlation value between the digital I signal and the digital Q signal.

The corrector 16 uses the correction parameter Cp to perform an IQ imbalance correction operation, corrects the IQ imbalance of the digital I signal Di and the digital Q signal Dq, and generates a corrected I signal Di' and a corrected Q signal Dq'. For example, the IQ imbalance correction operation is a linear transform operation.

The demodulator 17 generates a first demodulation correlation value Mi of the corrected I signal Di' and a second demodulation correlation value Mq of the corrected Q signal Dq' based on a mutual correlation function of a well-known I component and a well-known Q component in the radio signal to be demodulated, and the demodulator 17 generates a demodulated signal based on the generated first demodulation correlation value Mi and the generated second demodulation correlation value Mq. For example, the demodulator 17 includes a matched filter that generates the demodulated signal based on the mutual correlation function and a memory (for example, ROM (Read Only Memory)) in which the well-known I component and the well-known Q component are stored.

An operating principle of the correction controller 15 will be described below.

In an ideal state in which the IQ imbalance does not exist, the thermal noise based on a Gaussian distribution is mixed in the digital I signal QI and the digital Q signal Dq. Assuming that $n_I$ is the digital I signal Di in the ideal state and $n_Q$ is the digital Q signal Dq in the ideal state, equations 1 and 2 hold. That is, as expressed in equation 1, both a first power expected value $E[n_I^2]$ and a second power expected value $E[n_Q^2]$ are expressed in the ideal state using a thermal noise parameter $\sigma$ depending on magnitude of the thermal noise, and the first power expected value $E[n_I^2]$ is equal to the second power expected value $E[n_Q^2]$. As expressed in equation 2, a correlation value $E[n_I n_Q]$ between the digital I signal Di and the digital Q signal Dq is 0 in the ideal state. That is, in the ideal state, there is no correlation between the digital I signal Di and the digital Q signal Dq.

[Formula 1]

$$E[n_I^2] = E[n_Q^2] = \frac{\sigma^2}{2} \quad \text{(equation 1)}$$

[Formula 2]

$$E[n_I n_Q] = 0 \quad \text{(equation 2)}$$

On the other hand, in a normal state in which the IQ imbalance exists, as to the thermal noise mixed in the digital I signal Di and the digital Q signal Dq, the power expected values do not become equal to each other, but the power expected values are variables correlated with each other. Assuming that $n_I'$ is the digital I signal Di in the normal state and $n_Q'$ is the digital Q signal Dq in the normal state, equations 4 to 6 hold when influences of an IQ amplitude imbalance $\alpha$ and an IQ phase imbalance $\varphi$ are expressed by an equation 3. As expressed in the equations 4 and 5, a first power expected value $E[n_I'^2]$ in the normal state differs from a second power expected value $E[n_Q'^2]$ in the normal state. As expressed in the equation 6, in the normal state, there is a correlation between the digital I signal Di and the digital Q signal Dq.

[Formula 3]

$$n_I' = n_I$$
$$n_Q' = a(n_Q\cos\varphi + n_I\sin\varphi) \quad \text{(equation 3)}$$

[Formula 4]

$$E[n_I'^2] = \frac{\sigma^2}{2} \quad \text{(equation 4)}$$

[Formula 5]

$$E[n_Q'^2] = \frac{a^2\sigma^2}{2} \quad \text{(equation 5)}$$

[Formula 6]

$$E[n_I' n_Q'] = \frac{a\sigma^2\sin\varphi}{2} \quad \text{(equation 6)}$$

Therefore, the IQ amplitude imbalance $\alpha$ is expressed by an equation 7, and the IQ phase imbalance $\varphi$ is expressed by an equation 8.

[Formula 7]

$$a = \sqrt{\frac{E[n_Q'^2]}{E[n_I'^2]}} \quad \text{(equation 7)}$$

[Formula 8]

$$\varphi = \arcsin \frac{E[n_I' n_Q']}{\sqrt{E[n_I'^2]E[n_Q'^2]}} \quad \text{(equation 8)}$$

The first power calculator 151 estimates the first power expected value $E[n_I^{2\prime}]$ in the normal state based on an equation 9. The second power calculator 152 estimates the second power expected value $E[n_Q^{2\prime}]$ in the normal state based on an equation 10. The correlation value calculator 153 estimates a correlation expected value $E[n_I^{2\prime} n_Q^{2\prime}]$ in the normal state based on the equation 11. In the equations 9 to 11, N is the number of samples (that is, the number of measured values of the digital I signal Di and the digital Q signal Dq), $n_I(t)$ is the digital I signal Di at a time t, and $n_Q(t)$ is the digital Q signal Dq at the time t.

[Formula 9]

$$E[n_I'^2] = \lim_{N \to \infty} \frac{1}{N} \sum_{t=0}^{N-1} n_I^2(t) \quad \text{(equation 9)}$$

[Formula 10]

$$E[n_Q'^2] = \lim_{N \to \infty} \frac{1}{N} \sum_{t=0}^{N-1} n_Q^2(t) \quad \text{(equation 10)}$$

[Formula 11]

$$E[n_I' n_Q'] = \lim_{N \to \infty} \frac{1}{N} \sum_{t=0}^{N-1} n_I(t) n_Q(t) \quad \text{(equation 11)}$$

In the actual estimation, since the infinite number of samples N is hardly obtained unlike the equations 9 to 11, the number of samples N is cut off at a certain finite value. At this point, using the equations 9 to 11, an estimate value $\langle I^2 \rangle$ of the first power expected value $E[n_I^{2\prime}]$, an estimate value $\langle Q^2 \rangle$ of the second power expected value $E[n_Q^{2\prime}]$, and an estimate value $\langle IQ \rangle$ of the correlation expected value $E[n_I^{2\prime} n_Q^{2\prime}]$ are expressed by equations 12 to 14, respectively. The equations 12 to 14 mean that each of the first power calculator 151, the second power calculator 152, and the correlation value calculator 153 can be implemented by one multiplier, one adder, one register, and one divider. In the case of the fixed number of samples N, the divider can be eliminated.

[Formula 12]

$$\langle I^2 \rangle = \frac{1}{N} \sum_{t=0}^{N-1} n_I^2(t) \quad \text{(equation 12)}$$

[Formula 13]

$$\langle Q^2 \rangle = \frac{1}{N} \sum_{t=0}^{N-1} n_Q^2(t) \quad \text{(equation 13)}$$

[Formula 14]

$$\langle IQ \rangle = \frac{1}{N} \sum_{t=0}^{N-1} n_I(t) n_Q(t) \quad \text{(equation 14)}$$

The correction parameter generator 154 calculates the IQ amplitude imbalance $\alpha$ based on an equation 15 and calculates the IQ phase imbalance $\phi$ based on an equation 16. The IQ amplitude imbalance $\alpha$ indicates a difference in amplitude between the digital I signal Di and the digital Q signal Dq. The IQ phase imbalance $\phi$ indicates a difference in phase between the digital I signal Di and the digital Q signal Dq. The correction parameter generator 154 calculates a linear transform correction matrix to be set to the corrector 16. Then the correction parameter generator 154 outputs the correction parameters Cp to the corrector 16. The output correction parameters include the IQ amplitude imbalance $\alpha$, the IQ phase imbalance $\phi$, and the linear transform correction matrix.

[Formula 15]

$$a = \sqrt{\frac{\langle Q^2 \rangle}{\langle I^2 \rangle}} \quad \text{(equation 15)}$$

[Formula 16]

$$\varphi = \arcsin \frac{\langle IQ \rangle}{\sqrt{\langle I^2 \rangle \langle Q^2 \rangle}} \quad \text{(equation 16)}$$

Figure 2:
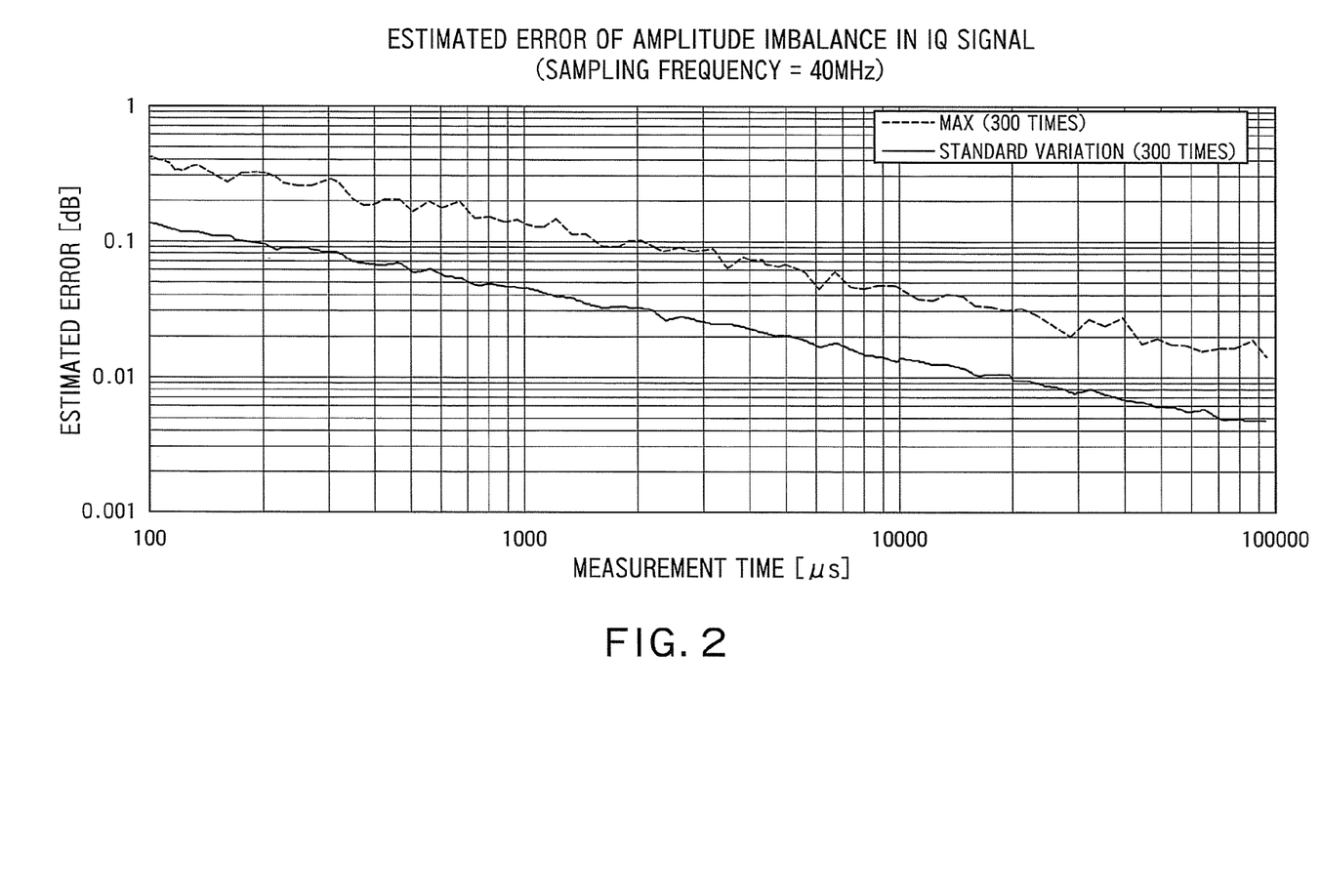
FIG. 2 is a graph illustrating a simulation result regarding an estimated error of amplitude imbalance in IQ signal of the first embodiment.
Figure 3:
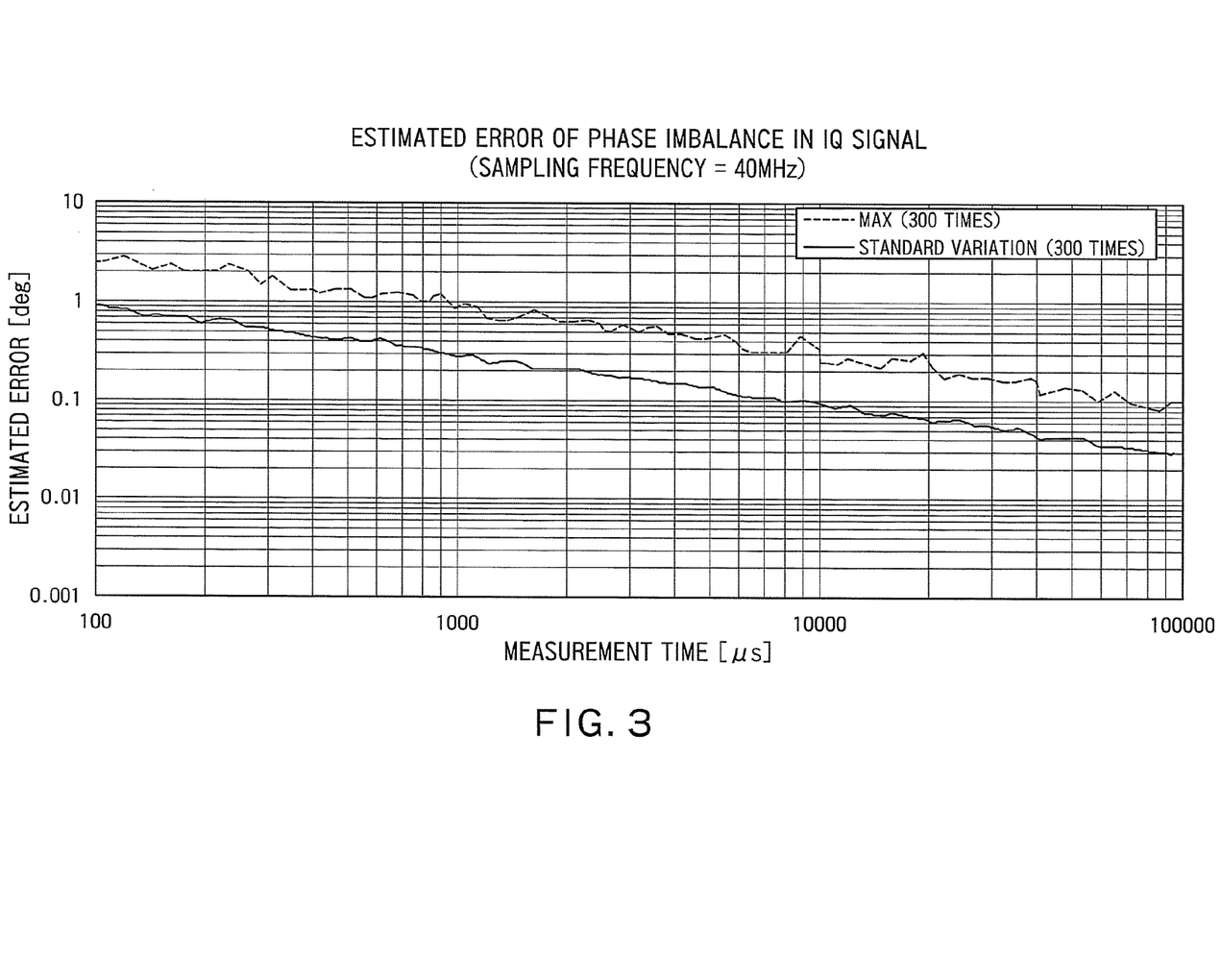
FIG. 3 is a graph illustrating a simulation result for an estimated error of phase imbalance in IQ signal of the first embodiment.

Preferably the number of samples N is a sufficiently large value such that a difference (estimated error of imbalance in IQ signal) between the power expected value (the first power expected value and the second power expected value) and the estimate value (estimate values of the first power expected value and the second power expected value) is included in an allowable range. FIG. 2 is a graph illustrating a simulation result regarding an estimated error of amplitude imbalance in IQ signal of the first embodiment. FIG. 3 is a graph illustrating a simulation result for an estimated error of phase imbalance in IQ signal of the first embodiment. FIGS. 2 and 3 illustrate the simulation results when the thermal noise is modeled using the AWGN model under the conditions of a sampling frequency of 40 MHz and the number of samples of 300. From FIGS. 2 and 3, for example, in a general-purpose wireless Local Area Network (LAN), it can be seen that the estimated error is sufficiently decreased for a measurement time of about 10 to about 100 ms.

According to the first embodiment, the correction controller 15 generates the correction parameter Cp by using the digital I signal Di and the digital Q signal Dq, so that the correction accuracy of the imbalance amount can be improved without increasing the circuit size and the production cost of the radio receiver 10.

Particularly, it is not necessary to test the IQ imbalance in producing the radio receiver 10, so that the production cost can be reduced. It is not necessary that a circuit for testing the IQ imbalance be provided in the radio receiver 10, so that the circuit size of the radio receiver 10 can be reduced. The IQ imbalance is corrected by using the digital I signal Di and the digital Q signal Dq, so that the correction accuracy can be improved.

Second Embodiment

A second embodiment of the invention will be described. The second embodiment is an example in which a determination whether the correction parameter Cp can be generated is made by using the digital I signal Di and the digital Q signal Dq. The same description as in the first embodiment will not be repeated here.

Figure 4:
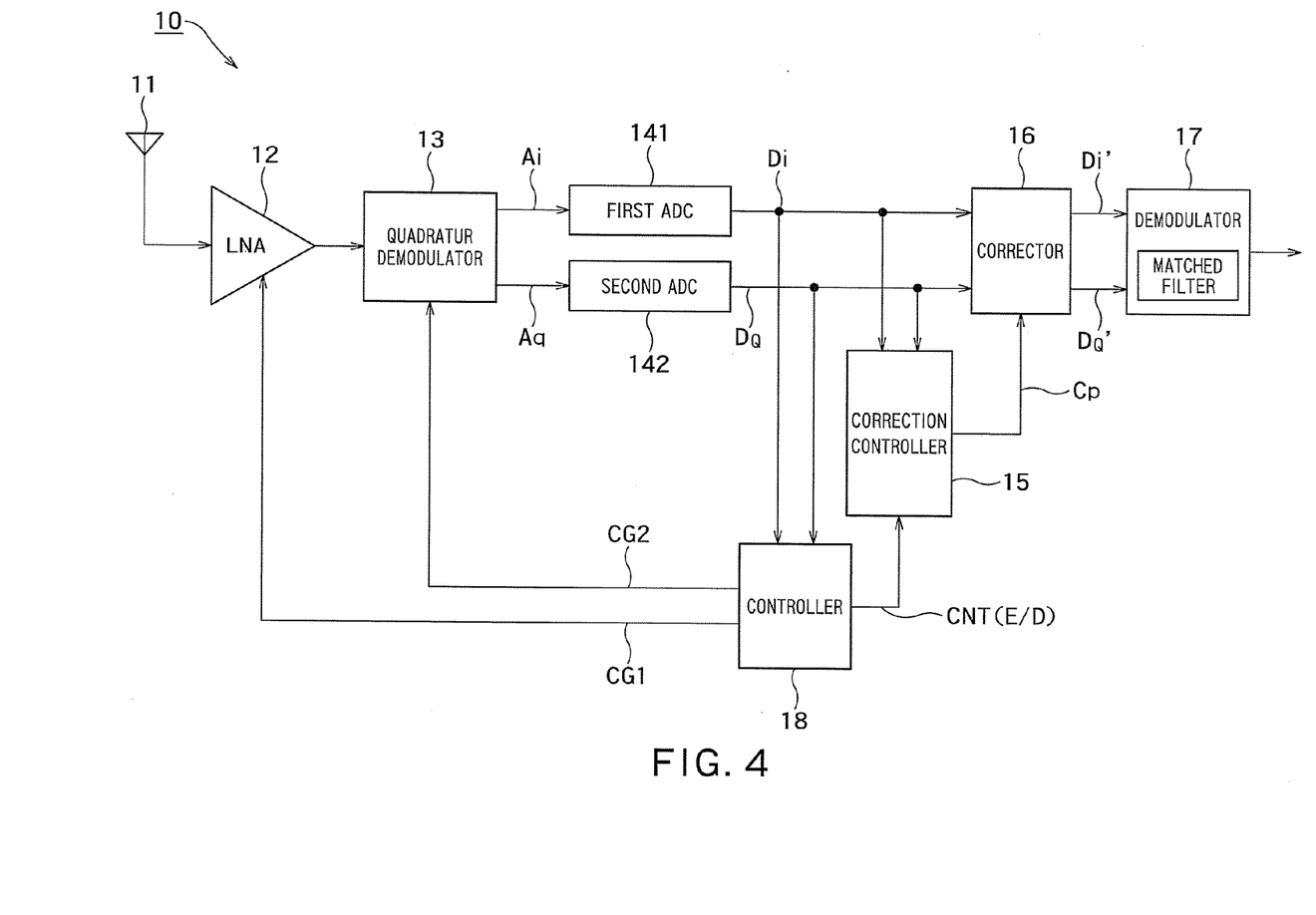
FIG. 4 is a configuration diagram illustrating a radio receiver 10 of the second embodiment.

A configuration of a radio receiver of the second embodiment will be described below. FIG. 4 is a configuration diagram illustrating a radio receiver 10 of the second embodiment.

The radio receiver 10 of FIG. 4 includes the antenna 11, the LNA 12, the quadrature demodulator 13, the first ADC 141, and the second ADC 142, the correction controller 15, the corrector 16, the demodulator 17, and the controller 18. The antenna 11, the LNA 12, the first ADC 141 and the second ADC 142, the corrector 16, and the demodulator 17 are identical to those of the first embodiment.

The controller 18 generates the first gain control signal GC1 for controlling the gain of the LNA 12 and a second gain control signal GC2 for controlling a gain of the quadrature demodulator 13 such that the thermal noise mixed by the LNA 12 is significantly larger than the quadrature demodulation noise mixed by the quadrature demodulator 13 and the AD conversion noise mixed by the first ADC141 and the second ADC 142.

The controller 18 generates a correction control signal CNT in order to control the operation of the correction controller 15. More specifically, the controller 18 determines whether the correction parameter Cp can be generated on the basis of the digital I signal Di and the digital Q signal Dq. When the correction parameter Cp can be generated, the controller 18 generates an enable signal CNT(E) in order to operate the correction controller 15. When the correction parameter Cp cannot be generated, the controller 18 generates a disable signal CNT(D) in order to stop the correction controller 15.

The quadrature demodulator 13 demodulates the output signal of the LNA 12 to generate the analog I signal Ai and the analog Q signal Aq based on the second gain control signal GC2. The quadrature demodulation noise is mixed in the analog I signal Ai and the analog Q signal Aq. Because the controller 18 generates the first gain control signal GC1 and the second gain control signal GC2, the quadrature demodulation noise is significantly smaller than the thermal noise. Accordingly, the noise component which is mixed in the analog I signal Ai and the analog Q signal Aq is substantially equal to the thermal noise.

When the controller 18 generates the enable signal CNT(E), the correction controller 15 models the thermal noise, which is mixed in the digital I signal Di and the digital Q signal Dq, by using the AWGN model. Then, the controller 18 generates the correction parameter Cp in order to correct the IQ imbalance. On the other hand, when the controller 18 generates the disable signal CNT(D), the correction controller 15 stops generation of the correction parameter Cp.

Figure 5:
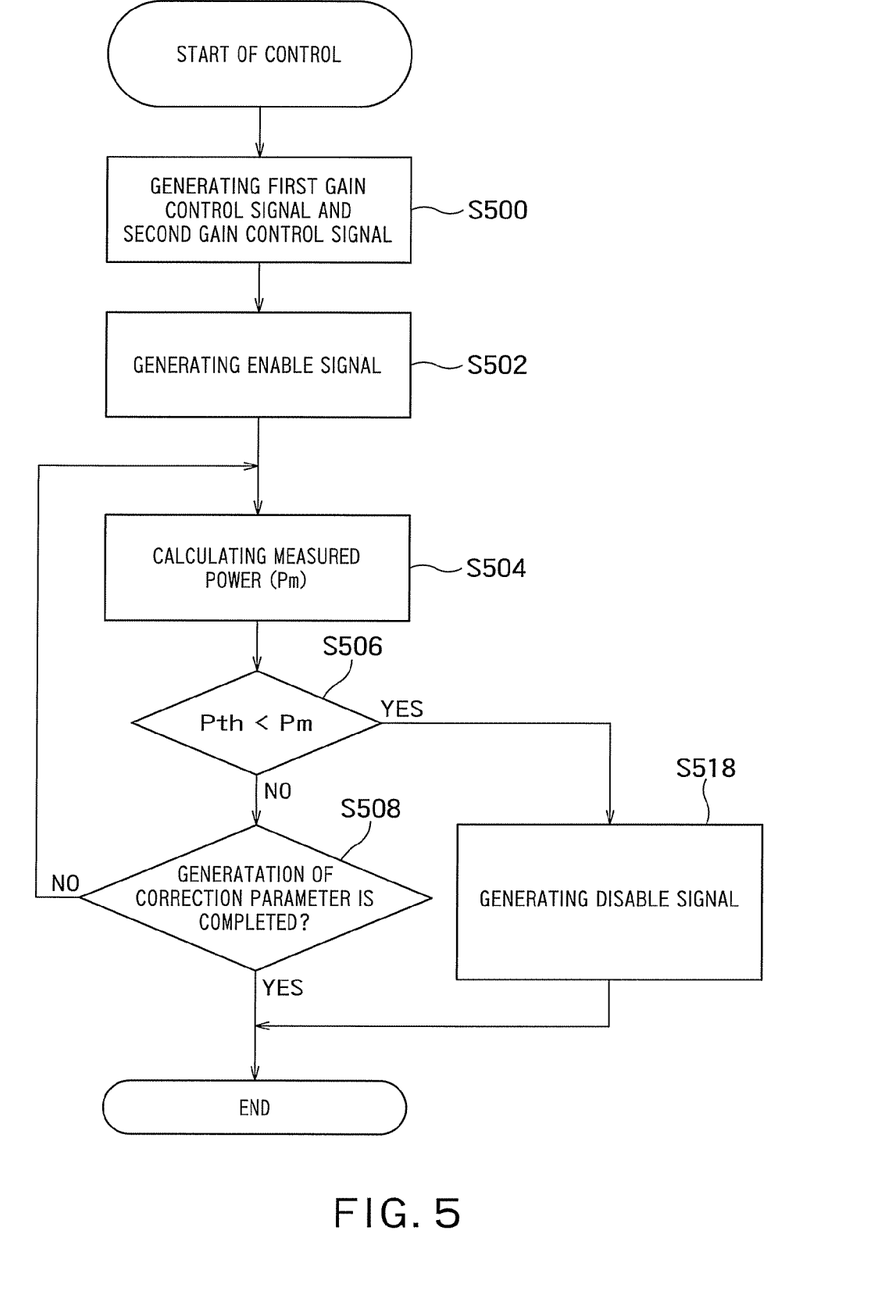
FIG. 5 is a flowchart illustrating control processing of the second embodiment.

An operation of the radio receiver of the second embodiment of the invention will be described. FIG. 5 is a flowchart illustrating control processing of the second embodiment.

<S500> The controller 18 generates the first gain control signal GC1 and the second gain control signal GC2. The LNA 12 and the quadrature demodulator 13 are operated on the basis of the first gain control signal GC1 and the second gain control signal GC2. Therefore, the thermal noise is significantly larger than the quadrature demodulation noise.

<S502> The controller 18 generates the enable signal CNT(E). When receiving the enable signal CNT(E), the correction controller 15 starts the generation of the correction parameter Cp.

<S504> The controller 18 monitors the digital I signal Di and the digital Q signal Dq, and the controller 18 calculates a measured power Pm based on the digital I signal Di and the digital Q signal Dq. More specifically, the controller 18 calculates the measured power Pm based on an equation 17. In the equation 17, m is the number of bits of the digital I signal Di and the digital Q signal Dq, Vrange is an input range [V] of the first ADC 141 and the second ADC 142, Zin is an input impedance [Ω] of the first ADC 141 and the second ADC 142, K is the number of smoothed samples. Moreover, Di(t) and Dq(t) are signal levels of the digital I signal Di and the digital Q signal Dq at the time t, respectively.

[Formula 17]

$$Pm[\text{dBm}] = 30 + 10 \log \frac{\sum_{t=0}^{K-1}(D_I^2(t) + D_Q^2(t))}{2^{2m}K} \frac{V_{range}^2}{Z_{in}} [\text{dBm}] \quad (\text{equation 17})$$

<S506> The controller 18 determines whether the correction parameter Cp can be generated (that is, whether the antenna 11 receives the radio signal) based on a difference between a measured power Pm and a power threshold Pth. When the measured power Pm is larger than the power threshold Pth (YES in S506), the controller 18 performs S518. On the other hand, when the measured power Pm is equal to or smaller than the power threshold Pth (NO in S506), the controller 18 performs. S508.

The fact that the measured power Pm is larger than the power threshold Pth means that the correction parameter Cp cannot be generated (that is, the correction parameter Cp for the proper correction cannot be generated) because the digital I signal Di and the digital Q signal Dq are influenced by the radio signal. For example, when the antenna 11 receives the radio signal during generation of the correction parameter Cp, the digital I signal Di and the digital Q signal Dq are influenced by the radio signal. Therefore, the measured power Pm is larger than the power threshold Pth.

On the other hand, the fact that the measured power Pm is equal to or smaller than the power threshold Pth means that the correction parameter Cp can be generated (that is, the correction parameter Cp for the proper correction can be generated) because the digital I signal Di and the digital Q signal Dq are not influenced by the radio signal.

The controller 18 calculates the power threshold Pth based on an equation 18. In the equation 18, Pn is a predetermined thermal noise power expected value, and Po is an offset value. The controller 18 also calculates the thermal noise power expected value Pn based on an equation 19. In the equation 19, k is a Boltzmann constant, T is an operating temperature of the LNA 12, B is a noise band width of the LNA 12, NF is a noise index of the radio receiver 10, and G is a sum of gains of the LNA 12 and the quadrature demodulator 13.

[Formula 18]

$$Pth\ [\text{dBm}] = Pn\ [\text{dBm}] + Po \quad (\text{equation 18})$$

[Formula 19]

$$Pn\ [\text{dBm}] = 10 \log kT\ [\text{dBm/Hz}] + 10 \log B\ [\text{Hz}] + NF\ [\text{dB}] + G\ [\text{dB}] \quad (\text{equation 19})$$

<S508> The controller 18 determines whether the generation of the correction parameter Cp is completed. When the generation of the correction parameter Cp is completed (YES in S508), the control processing is ended. On the other hand, when the generation of the correction parameter Cp is not completed (NO in S508), the flow returns to S504.

<S518> The controller 18 generates the disable signal CNT(D). When receiving the disable signal CNT(D), the correction controller 15 stops the generation of the correction parameter Cp.

In the second embodiment, the controller 18 may perform S500 after a predetermined time elapses since the disable signal CNT(D) is generated.

In the second embodiment, in S504, instead of calculating the measured power Pm based on the digital I signal Di and the digital Q signal Dq, the controller 18 may calculate the measured power Pm based on the corrected I signal Di' and the corrected Q signal Dq'. This is because the IQ imbalance correction operation does not largely change the signal level (that is, the signal levels of the digital I signal Di and the digital Q signal Dq are substantially equal to the signal levels of the corrected I signal Di' and the corrected Q signal Dq').

According to the second embodiment, the controller 18 determines whether the correction parameter Cp for the proper correction can be generated on basis of the digital I signal Di and the digital Q signal Dq. Moreover, the controller 18 controls the correction controller 15 such that the generation of the correction parameter Cp is stopped when the correction parameter Cp cannot be generated. Therefore, the generation of the correction parameter Cp, which causes the improper correction, can be prevented, and the correction accuracy of the imbalance amount can be improved better than that of the first embodiment.

Third Embodiment

A third embodiment of the invention will be described. In the second embodiment, whether the correction parameter Cp can be generated is determined on the basis of the digital I signal Di and the digital Q signal Dq. On the other hand, the third embodiment is an example in which the determination whether the correction parameter Cp can be generated is made on the basis of the correlation value which is the output of the matched filter in the demodulator. The same description as in the first and second embodiments will not be repeated here.

Figure 6:
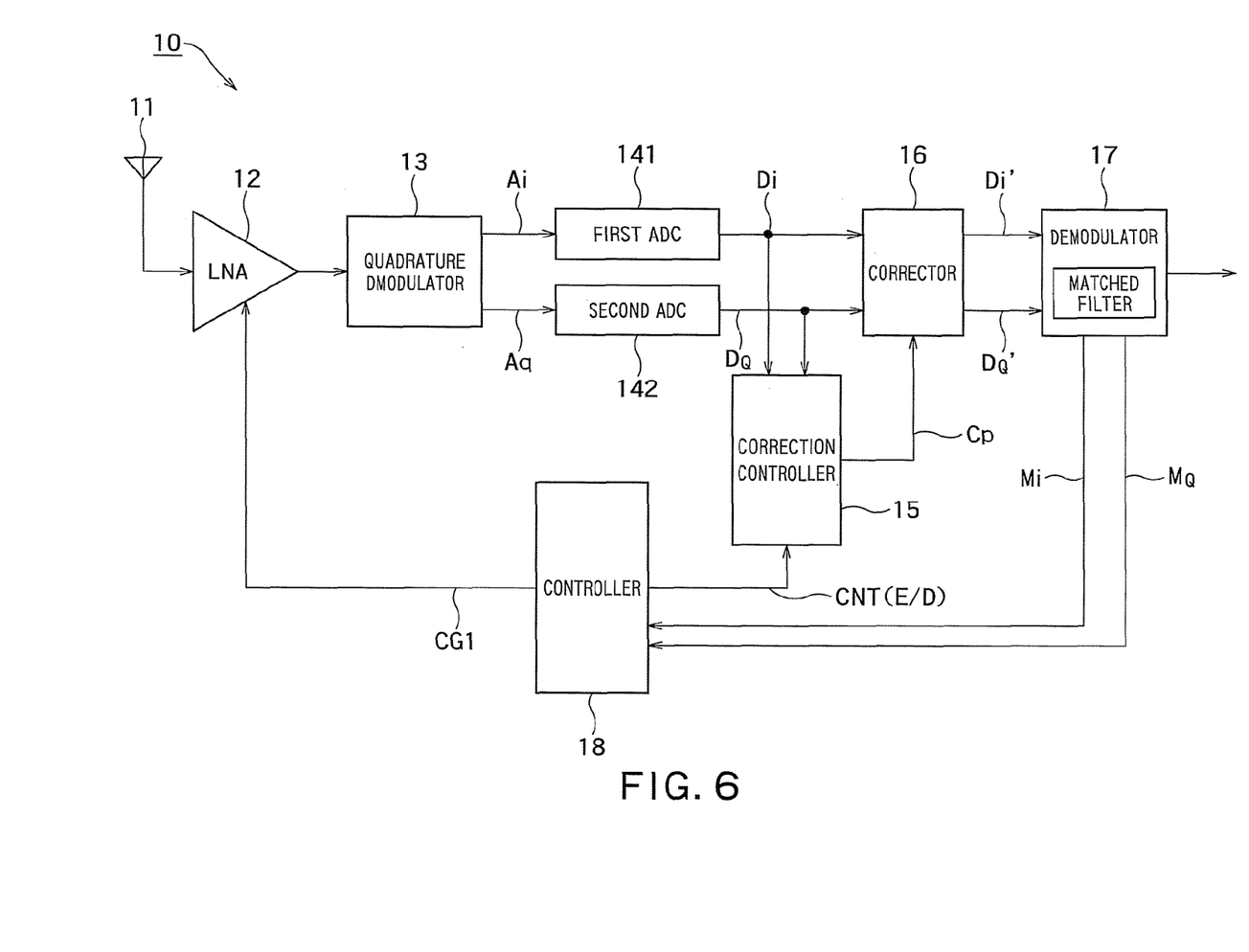
FIG. 6 is a configuration diagram illustrating the radio receiver 10 according to the third embodiment.

A configuration of a radio receiver of the third embodiment will be described below. FIG. 6 is a configuration diagram illustrating the radio receiver 10 according to the third embodiment.

The radio receiver 10 of FIG. 6 includes the antenna 11, the LNA 12, the quadrature demodulator 13, the first ADC 141, the second ADC 142, the correction controller 15, the corrector 16, the demodulator 17, and the controller 18. The antenna 11, the LNA 12, the quadrature demodulator 13, the first ADC141 and the second ADC 142, the corrector 16, and the demodulator are identical to those of the first embodiment. The correction controller 15 is identical to that of the second embodiment.

The controller 18 generates the first gain control signal GC1 for controlling the gain of the LNA 12 such that the thermal noise mixed by the LNA 12 is significantly larger than the quadrature demodulation noise mixed by the quadrature demodulator 13 and the AD conversion noise mixed by the first ADC 141 and the second ADC 142.

The controller 18 generates the correction control signal CNT in order to control the operation of the correction controller 15. More specifically, the controller 18 determines whether the correction parameter Cp can be generated on the basis of the first demodulation correlation value Mi and the second demodulation correlation value Mq. When the correction parameter Cp can be generated, the controller 18 generates the enable signal CNT(E) in order to operate the correction controller 15. When the correction parameter Cp cannot be generated, the controller 18 generates the disable signal CNT(D) in order to stop the correction controller 15.

Figure 7:
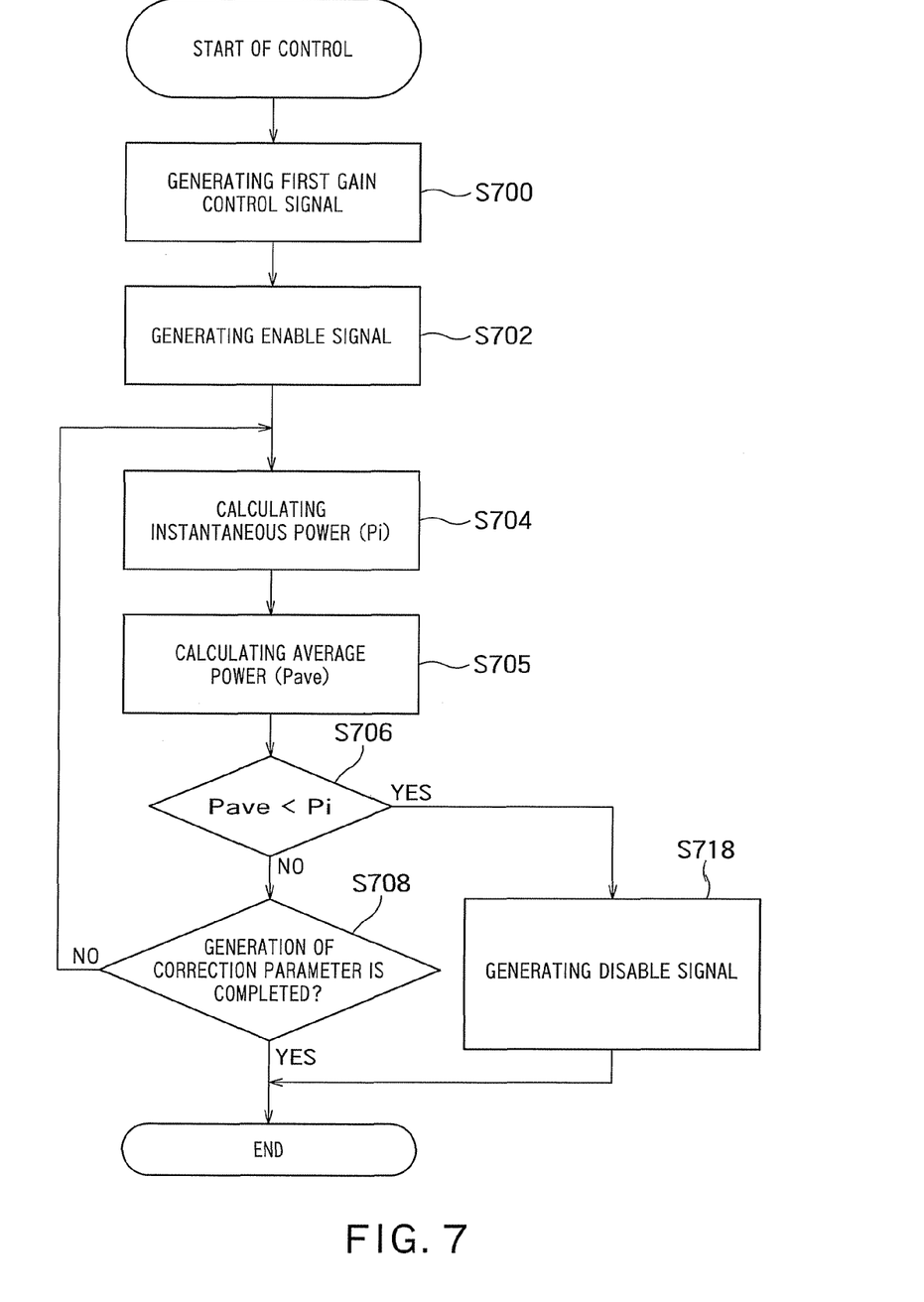
FIG. 7 is a flowchart illustrating control processing of the third embodiment.

An operation of the radio receiver of the third embodiment will be described below. FIG. 7 is a flowchart illustrating control processing of the third embodiment. FIG. 8 is a graph illustrating a relationship between an average power Pave and an instantaneous power Pi of the third embodiment.

<S700> The controller 18 generates the first gain control signal GC1. The LNA 12 is operated on the basis of the first gain control signal GC1. Therefore, the thermal noise is significantly larger than the quadrature demodulation noise.

<S702> The processing in S702 is identical to that (S502 of FIG. 5) of the second embodiment.

<S704> The controller 18 calculates the instantaneous power Pi of the matched filter at the time t based on an equation 20. In the equation 20, Mi(t) is the first demodulation correlation value at the time t, and Mq(t) is the second demodulation correlation value at the time t.

[Formula 20]

$$Pi = 10 \log(M_I^2(t) + M_Q^2(t)) \qquad \text{(equation 20)}$$

<S705> The controller 18 calculates the average power Pave of the matched filter up to the time t based on an equation 21. In the equation 21, K is the number of samples used to calculate the average power Pave.

[Formula 21]

$$Pave = 10 \log \frac{\sum_{t'=t-1}^{t-K} Mi^2(t') + Mq^2(t')}{K} \qquad \text{(equation 21)}$$

<S706> The controller 18 determines whether the correction parameter Cp can be generated (that is, whether the antenna 11 receives the radio signal) on the basis of a difference between the instantaneous power Pi and the average power Pave. When the instantaneous power Pi is larger than a value in which a proper offset value Po is added to the average power Pave (YES in S708), the controller 18 performs S718. On the other hand, when the instantaneous power Pi is equal to or smaller than the sum (Pave+Po) of the average power Pave and a predetermined offset value Po (for example, 10 [dB]) (NO in S706), the controller 18 performs S708.

Figure 8A:
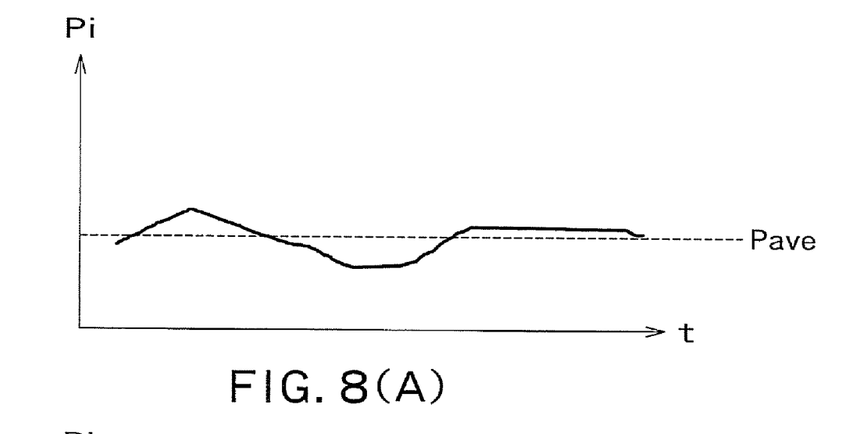
FIG. 8(A) and FIG. 8(B) are graphs illustrating a relationship between an average power Pave and an instantaneous power Pi of the third embodiment.
Figure 8B:
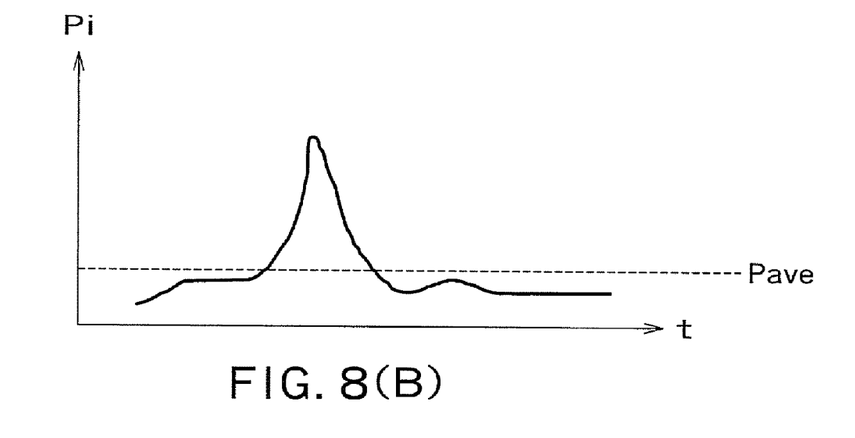

As illustrated in FIG. 8B, the fact that the instantaneous power Pi is larger than the sum (Pave+Po) of the average power Pave and the offset value Po means that the correction parameter Cp for the proper correction cannot be generated because the digital I signal Di and the digital Q signal Dq are influenced by the radio signal. For example, when the antenna 11 receives the radio signal during generation of the correction parameter Cp, the digital I signal Di and the digital Q signal Dq are influenced by the radio signal, and the instantaneous power Pi is larger than the sum (Pave+Po) of the average power Pave and the offset value Po.

On the other hand, as illustrated in FIG. 8A, the fact that the instantaneous power Pi is equal to or smaller than the sum (Pave+Po) of the average power Pave and the offset value Po means that the correction parameter Cp for the proper correction can be generated because the digital I signal Di and the digital Q signal Dq are not influenced by the radio signal.

<S708 and S718> The pieces of processing in S708 and S718 are identical to those (S508 and S518 of FIG. 5) of the second embodiment.

In the third embodiment, the controller 18 may perform S700 after a predetermined time elapses since the disable signal CNT(D) is generated.

According to the third embodiment, the controller 18 determines whether the correction parameter Cp for the proper correction can be generated by using the first demodulation correlation value Mi and the second demodulation correlation value Mq, which are the outputs of the matched filter in the demodulator 17. Moreover, the controller 18 controls the correction controller 15 such that generation of the correction parameter Cp is stopped when the correction parameter Cp cannot be generated. Therefore, generation of the correction parameter Cp, which causes the improper correction, can be prevented, and the correction accuracy of the imbalance amount can be improved better than that of the first and second embodiments. Particularly, in the third embodiment, the correction accuracy of the imbalance amount can be improved better than that of the second embodiment when a signal waveform of the radio signal is previously learned.

At least a portion of the radio receiver 10 according to the above-described embodiments may be composed of hardware or software. When at least a portion of the radio receiver 10 is composed of software, a program for executing at least some functions of the radio receiver 10 may be stored in a recording medium, such as a flexible disk or a CD-ROM, and a computer may read and execute the program. The recording medium is not limited to a removable recording medium, such as a magnetic disk or an optical disk, but it may be a fixed recording medium, such as a hard disk or a memory.

In addition, the program for executing at least some functions of the radio receiver 10 according to the above-described embodiment may be distributed through a communication line (which includes wireless communication) such as the Internet. In addition, the program may be encoded, modulated, or compressed and then distributed by wired communication or wireless communication such as the Internet. Alternatively, the program may be stored in a recording medium, and the recording medium having the program stored therein may be distributed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A radio receiver comprising:
an antenna configured to receive a radio signal;
a low-noise amplifier configured to amplify an output signal of the antenna with a low noise;
a quadrature demodulator configured to demodulate an output signal of the low-noise amplifier, and to generate an analog I signal of an in-phase component and an analog Q signal of a quadrature component;
a first analog-to-digital converter (ADC) configured to convert the analog I signal into a digital I signal of the in-phase component;
a second analog-to-digital converter (ADC) configured to convert the analog Q signal into a digital Q signal of the quadrature component;
a first power calculator configured to calculate a first power expected value of the digital I signal;
a second power calculator configured to calculate a second power expected value of the digital Q signal;
a correlation value calculator configured to calculate a correlation value between the digital I signal and the digital Q signal;
a correction parameter generator configured to generate a correction parameter based on the first power expected value, the second power expected value, and the correlation value between the digital I signal and the digital Q signal;
a corrector configured to perform a linear transform operation using the correction parameter, to correct an IQ imbalance of the digital I signal and the digital Q signal, and to generate a corrected I signal and a corrected Q signal;
a demodulator configured to demodulate the corrected I signal and the corrected Q signal, and to generate a demodulated signal; and
a controller configured to generate a gain control signal in order to control a gain of the low-noise amplifier in such a manner that a thermal noise mixed by the low-noise amplifier is larger than a quadrature demodulation noise mixed by the quadrature demodulator and an analog-digital conversion noise mixed by the analog-to-digital converters,
wherein the low-noise amplifier is operated on the basis of the gain control signal.

2. The receiver of claim 1, wherein the correction parameter comprises:
an IQ amplitude imbalance indicating a difference in amplitude between the digital I signal and the digital Q signal; and
an IQ phase imbalance indicating a difference in phase between the digital I signal and the digital Q signal.

3. The receiver of claim 2, wherein the controller generates a correction control signal in order to control the first power calculator, the second power calculator, and the correlation value calculator in such a manner that the generation of the correction parameter is stopped when the antenna receives the radio signal, and
wherein the first power calculator, the second power calculator, and the correlation value calculator are operated on the basis of the correction control signal.

4. The receiver of claim 3, wherein the controller calculates a thermal noise power of the digital I signal and the digital Q signal and determines whether the radio signal is received by the antenna based on a difference between the thermal noise power and a power threshold.

5. The receiver of claim 4, wherein
the demodulator comprises a matched filter configured to generate a first demodulation correlation value of the corrected I signal and a second demodulation correlation value of the corrected Q signal, and
the controller calculates an instantaneous power and an average power of the matched filter based on the first demodulation correlation value and the second demodulation correlation value, and the controller determines whether the radio signal is received by the antenna based on a difference between the instantaneous power and the average power.

6. The receiver of claim 3, wherein
the demodulator comprises a matched filter configured to generate a first demodulation correlation value of the corrected I signal and a second demodulation correlation value of the corrected Q signal, and
the controller calculates an instantaneous power and an average power of the matched filter based on the first demodulation correlation value and the second demodulation correlation value, and the controller determines whether the radio signal is received by the antenna based on a difference between the instantaneous power and the average power.

7. The receiver of claim 2, wherein the controller calculates a thermal noise power of the digital I signal and the digital Q signal and determines whether the radio signal is received by the antenna based on a difference between the thermal noise power and a power threshold.

8. The receiver of claim 7, wherein
the demodulator comprises a matched filter configured to generate a first demodulation correlation value of the corrected I signal and a second demodulation correlation value of the corrected Q signal, and
the controller calculates an instantaneous power and an average power of the matched filter based on the first demodulation correlation value and the second demodulation correlation value, and the controller determines whether the radio signal is received by the antenna based on a difference between the instantaneous power and the average power.

9. The receiver of claim 2, wherein
the demodulator comprises a matched filter configured to generate a first demodulation correlation value of the corrected I signal and a second demodulation correlation value of the corrected Q signal, and
the controller calculates an instantaneous power and an average power of the matched filter based on the first demodulation correlation value and the second demodulation correlation value, and the controller determines whether the radio signal is received by the antenna based on a difference between the instantaneous power and the average power.

10. The receiver of claim 1, wherein the controller generates a correction control signal in order to control the first power calculator, the second power calculator, and the correlation value calculator in such a manner that the generation of the correction parameter is stopped when the antenna receives the radio signal, and
wherein the first power calculator, the second power calculator, and the correlation value calculator are operated on the basis of the correction control signal.

11. The receiver of claim 10, wherein the controller calculates a thermal noise power of the digital I signal and the digital Q signal and determines whether the radio signal is received by the antenna based on a difference between the thermal noise power and a power threshold.

12. The receiver of claim 11, wherein
the demodulator comprises a matched filter configured to generate a first demodulation correlation value of the corrected I signal and a second demodulation correlation value of the corrected Q signal, and
the controller calculates an instantaneous power and an average power of the matched filter based on the first demodulation correlation value and the second demodulation correlation value, and the controller determines whether the radio signal is received by the antenna based on a difference between the instantaneous power and the average power.

13. The receiver of claim 10, wherein
the demodulator comprises a matched filter configured to generate a first demodulation correlation value of the corrected I signal and a second demodulation correlation value of the corrected Q signal, and
the controller calculates an instantaneous power and an average power of the matched filter based on the first demodulation correlation value and the second demodulation correlation value, and the controller determines whether the radio signal is received by the antenna based on a difference between the instantaneous power and the average power.

14. The receiver of claim 1, wherein the controller calculates a thermal noise power of the digital I signal and the digital Q signal and determines whether the radio signal is received by the antenna based on a difference between the thermal noise power and a power threshold.

15. The receiver of claim 14, wherein
the demodulator comprises a matched filter configured to generate a first demodulation correlation value of the corrected I signal and a second demodulation correlation value of the corrected Q signal, and
the controller calculates an instantaneous power and an average power of the matched filter based on the first demodulation correlation value and the second demodulation correlation value, and the controller determines whether the radio signal is received by the antenna based on a difference between the instantaneous power and the average power.

16. The receiver of claim 1, wherein
the demodulator comprises a matched filter configured to generate a first demodulation correlation value of the corrected I signal and a second demodulation correlation value of the corrected Q signal, and
the controller calculates an instantaneous power and an average power of the matched filter based on the first demodulation correlation value and the second demodulation correlation value, and the controller determines whether the radio signal is received by the antenna based on a difference between the instantaneous power and the average power.

17. A method for controlling a radio receiver, the method comprising:
receiving a radio signal;
amplifying the received radio signal;
demodulating the amplified radio signal;
generating an analog I signal of an in-phase component and an analog Q signal of a quadrature component;
converting the analog I signal into a digital I signal of the in-phase component;
converting the analog Q signal into a digital Q signal of the quadrature component;
calculating a first power expected value of the digital I signal;
calculating a second power expected value of the digital Q signal;
calculating a correlation value between the digital I signal and the digital Q signal;
generating a correction parameter based on the first power expected value, the second power expected value, and the correlation value between the digital I signal and the digital Q signal;
performing a linear transform operation using the correction parameter;

correcting an IQ imbalance of the digital I signal and the digital Q signal;

generating a corrected I signal and a corrected Q signal;

demodulating the corrected I signal and the corrected Q signal;

generating a demodulated signal; and generating a gain control signal in order to control a gain in amplifying the received radio signal in such a manner that a thermal noise mixed in amplifying the received radio signal is larger than a quadrature demodulation noise mixed in demodulating the amplified radio signal and an analog-digital conversion noise mixed in converting the analog I signal and the analog Q signal, wherein in amplifying the received radio signal, the gain control signal is used.

18. The method of claim 17, wherein the correction parameter comprises:

an IQ amplitude imbalance indicating a difference in amplitude between the digital I signal and the digital Q signal; and an IQ phase imbalance indicating a difference in phase between the digital I signal and the digital Q signal.

19. The method of claim 18, wherein generating the gain control signal comprises generating a correction control signal in order to control calculation of the first power expected value, calculation of the second power expected value, and calculation of the correlation value in such a manner that the generation of the correction parameter is stopped when the radio signal is received, and wherein calculating the first power expected value, calculating the second power expected value, and calculating the correlation value are performed on the basis of the correction control signal.

20. The method of claim 17, wherein generating the gain control signal comprises generating a correction control signal in order to control calculation of the first power expected value, calculation of the second power expected value, and calculation of the correlation value in such a manner that the generation of the correction parameter is stopped when the radio signal is received, and wherein calculating the first power expected value, calculating the second power expected value, and calculating the correlation value are performed on the basis of the correction control signal.

* * * * *